US006201703B1

(12) United States Patent
Yamada et al.

(10) Patent No.: US 6,201,703 B1
(45) Date of Patent: Mar. 13, 2001

(54) SECURITY CAGE FOR GAME MACHINE AND GAME MACHINE USING THE SAME

(75) Inventors: Norifumi Yamada, Kawasaki (JP); Shiro Majima, Artarmon (AU); Naoto Shirai, Machida; Kazuhiro Kusuda, Hiratsuka, both of (JP)

(73) Assignee: Konami Co., Ltd., Hyogo-ken (JP)

( * ) Notice: Subject to any disclaimer, the term of this patent is extended or adjusted under 35 U.S.C. 154(b) by 0 days.

(21) Appl. No.: 09/109,359

(22) Filed: Jul. 2, 1998

(30) Foreign Application Priority Data

Aug. 7, 1997 (JP) .................................................. 9-213443

(51) Int. Cl.[7] ...................................................... H05K 5/00

(52) U.S. Cl. ......................... 361/752; 361/801; 220/4.02; 70/57.1; 312/223.2

(58) Field of Search .................................... 361/752, 753, 361/759, 801; 312/7.2, 223.2; 220/4.02; 70/57.1, 77

(56) References Cited

U.S. PATENT DOCUMENTS 4,440,457 * 4/1984 Fogeman et al. ..................... 312/7.2
4,658,956 * 4/1987 Takeda et al. ....................... 206/320

FOREIGN PATENT DOCUMENTS 9-239095 9/1997 (JP) .

* cited by examiner

*Primary Examiner*—Jayprakash N. Gandhi
(74) *Attorney, Agent, or Firm*—Jordan and Hamburg LLP

(57) ABSTRACT

A security cage which is installed in a housing of a game machine so as to accommodate various types of electric components. The security cage includes: a cage main body having an opening provided at the front thereof; a partition wall for dividing the inside of the cage main body into an inaccessible region and an accessible region each communicating with the opening; a front wall which is provided so as to close the inaccessible region, and which has an openable-and-closable lid provided at least at a part thereof; screws which are hidden within the inaccessible region when the lid is closed, and which connects the front wall and the cage main body at positions where the screws can be operated from the outside of the cage main body when the lid is opened; and a lock for restricting the opening and closing of the lid. Disclosed also is a game machine using the security cage.

7 Claims, 5 Drawing Sheets

SECURITY CAGE FOR GAME MACHINE AND GAME MACHINE USING THE SAME

BACKGROUND OF THE INVENTION

1. Field of the Invention

The present invention relates to a security cage provided in a housing of a game machine, such as a slot machine, for accommodating various types of electric components such as a control board and so forth, and to a game machine using the same.

2. Description of the Related Art

In game machines, such as slot machines, in order to prevent an electric component related to control of the progress of the game, such as a ROM storing a probability of and a score for success, from being unfairly changed, a container with a lock, called a security cage, is installed inside a housing, and substrates are accommodated in the security cage so as to be prevented from being attached and detached.

The security cage has been conventionally constructed to accommodate only predetermined electric components to be prevented from being attached and detached, and other electric components which are to be less strongly prevented from being attached and detached, such as components for converting the power-supply voltage, are accommodated in a box separately provided in the housing from the security cage.

According to the conventional structure as described above, it is necessary to prepare separate containers for the electric components to be prevented from being attached and detached and for other components, so that the limited space within the housing is not sufficiently used. Moreover, since both containers need to be connected by wiring, a number of wires are routed in confusion within the housing, and these wires obstruct maintenance and control of the inside of the housing, thus reducing operability.

SUMMARY OF THE INVENTION

Accordingly, it is an object of the present invention to provide a security cage capable of organizing the arrangement of electric components within a housing, and a game machine using the same.

According to an aspect of the present invention, there is provided a security cage for a game machine installed in a housing of the game machine so as to accommodate various types of electric components. The security cage includes: a cage main body having an opening provided at the front thereof; a partition wall for dividing the inside of the cage main body into an inaccessible region and an accessible region each communicating with the opening; a front wall which is provided so as to close the inaccessible region and which has an openable-and-closable lid provided at least at a part thereof; connecting means which is hidden within the inaccessible region when the lid is closed and which connects the front wall and the cage main body at positions where the connecting means can be operated from the outside of the cage main body when the lid is opened; and lock means for restricting the opening and closing of the lid.

By the above arrangement, the inaccessible region and the accessible region are formed in the security cage, so that even the components other than those to be prevented from being attached and detached can be accommodated in the single cage main body. Only the inaccessible region is restricted in opening by means of the lock, and the components to be accommodated in the accessible region are not excessively prevented from being attached and detached. Therefore, the electric components in the housing can be arranged collectively in one space, and the number of cables to be routed within the housing can be reduced to organize the inside of the housing, thereby increasing operability and appearance.

In the security cage, the front wall may be integrally formed with the partition wall so as to be attachable and detachable to and from the cage main body.

By the above arrangement, the inaccessible region and the accessible region become a continuous region when the front wall is removed, so that the accessible region can be used as a space for attaching and detaching components in the inaccessible region.

The security cage may further include partition means for partitioning the inaccessible region into a first region adjacent to the accessible region via the partition wall and a second region separated from the accessible region by the first region. In the security cage, the front wall may include a fixed wall portion integrally formed with the partition wall and fixed to the cage main body through the connecting means so as to close the first region, and the lid may be connected to the fixed wall portion so as to open and close the second region.

By the above arrangements, the second region is opened when the lock means is unlocked to open the lid, and the first region is opened when the fixed wall portion and the cage main body are disconnected. Therefore, the first region and the second region can be used properly in accordance with frequency of attaching and detaching the components, and maintenance and checking, and the inside of the security cage can be organized.

The security cage may further include a case capable of being inserted in and extracted from the cage main body. By this arrangement, the components can be easily attached and detached to and from the accessible region by insertion and extraction of the case.

In the security cage, mounting portions for a control board across the inaccessible region and the accessible region may be provided at the back of the cage main body. By this arrangement, the components of the inaccessible region and the accessible region can be mounted on a common control board, so that the number of steps of the wiring operation between the components can be reduced.

According to another aspect of the present invention, there is provided a game machine including the security cage which includes: the cage main body having the opening provided at the front thereof; the partition wall for dividing the inside of the cage main body into the inaccessible region and the accessible region each communicating with the opening; the front wall which is provided so as to close the inaccessible region and which has the openable-and-closable lid provided at least at a part thereof; connecting means which is hidden within the inaccessible region when the lid is closed and which connects the front wall and the cage main body at positions where the connecting means can be operated from the outside of the cage main body when the lid is opened; and the lock means for restricting the opening and closing of the lid, wherein the mounting portions for a control board are provided at the back of the cage main body across the inaccessible region and the accessible region, wherein a control board extending across the inaccessible region and the accessible region is mounted at the back of the cage main body, wherein connecting means for first electric components to be prevented from being attached and detached are provided at a portion of the control board opposing the inaccessible region, and wherein connecting means for second electric components to be less strongly prevented from being attached and detached than the first electric components is provided at a portion of the control board opposing the accessible region.

By the above arrangements, the components to be differently prevented from being attached and detached are accommodated in the common security cage so as to be connected to the common control board, so that the components to be accommodated in the housing can be arranged collectively in one space, and the number of cables to be routed within the housing can be reduced to organize the inside of the housing, thereby increasing operability and appearance.

The components to be accommodated in each of the regions may be suitably selected as required. For example, in the game machine, the inaccessible region may be divided into the first region adjacent to the accessible region via the partition wall and a second region separated from the accessible region by the first region, and an electric substrate having mounted thereon a control board may be accommodated in the second region, and a flexible cable may be accommodated in the first region so as to be connected to the control board. In addition, in the game machine, a case capable of being inserted and extracted may be provided in the accessible region, and a component related to a power control is accommodated in the case.

Other features and objects of the present invention will be made clear together with variation thereof from the following description regarding the preferred embodiment with reference to the accompanying drawings.

BRIEF DESCRIPTION OF THE DRAWINGS

FIGS. 5A and 5B illustrate a construction of a slot machine to which the security cage according to an embodiment of the present invention is assembled, in which FIG. 5A is a perspective view showing a state where a door of a housing is closed; and FIG. 5B is a perspective view showing the internal structure by opening the door of the housing.

DESCRIPTION OF THE PREFERRED EMBODIMENT

Figure 5B:
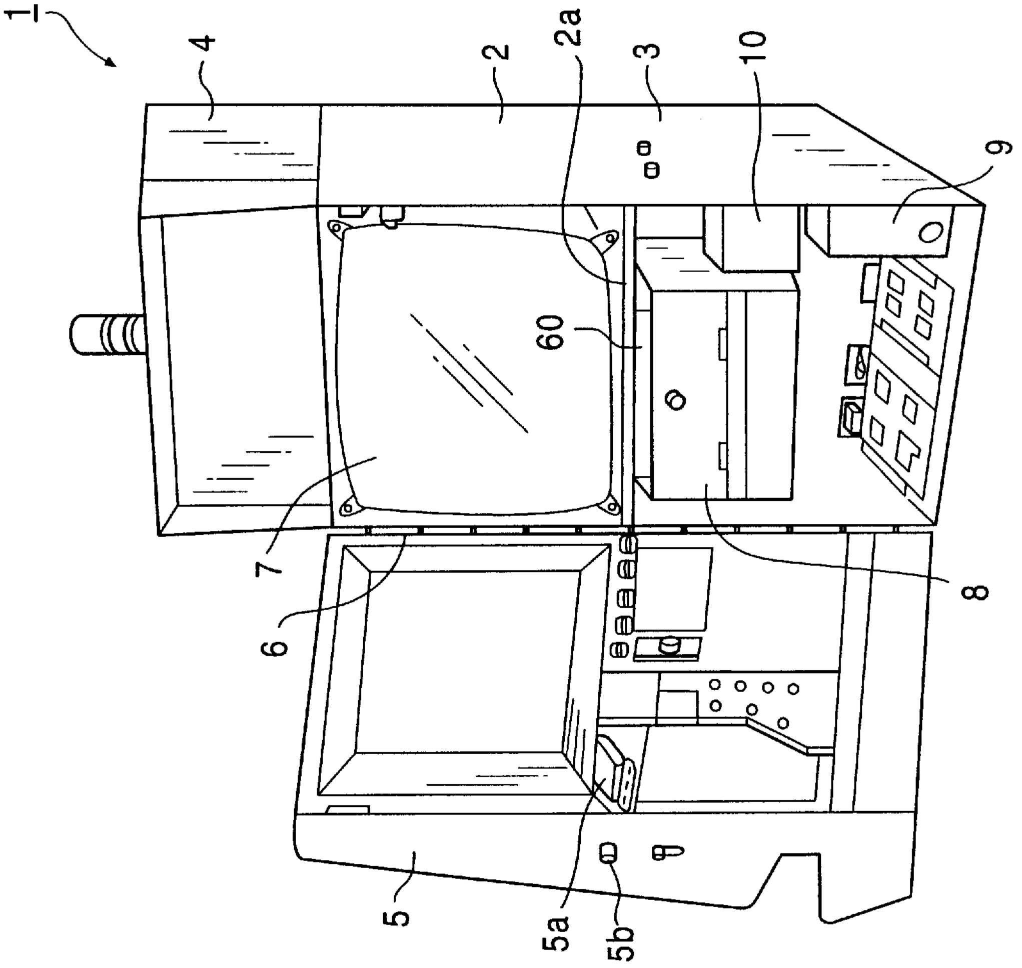
Figure 5A:
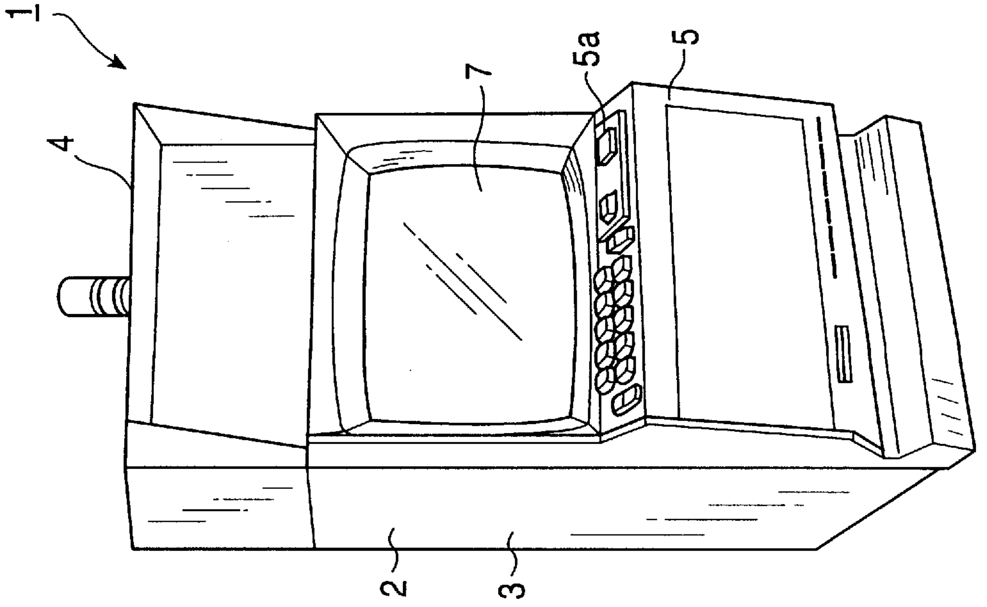

FIG. 5 shows a slot machine according to an embodiment of the present invention. A slot machine 1 is composed of a longitudinal housing 2 having various types of components fitted to the inside and the outside thereof. The housing 2 has a main body 3 and a top box 4 mounted on the main body 3. A door 5 is mounted to the front of the main body 3 so as to be opened and closed through a hinge 6 fitted to the left of the door 5. A monitor 7 is accommodated in the main body 3, and a security cage 8, an AC power-supply unit 9 and a mount base 10 for mounting a device (not shown) for checking a piece of paper inserted in a slip insert 5*a* are provided below the monitor 7. The opening and closing of the door 5 is restricted by a lock 5*b* provided at the right thereof.

Figure 1:
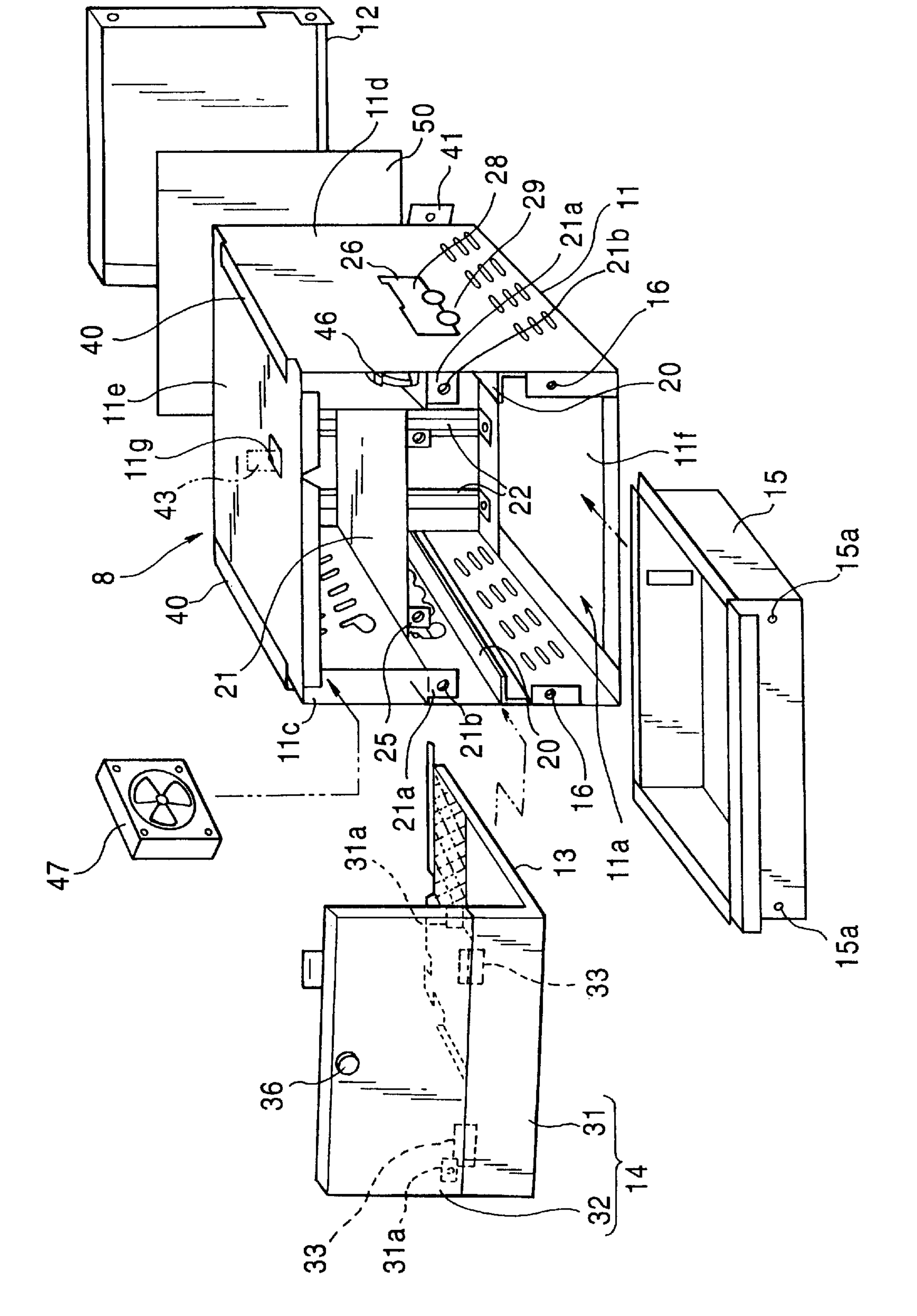
FIG. 1 is an exploded perspective view of a security cage according to an embodiment of the present invention.

As shown in FIG. 1, the security cage 8 includes a cage main body 11, a back cover 12 provided at the back of the cage main body 11, a partition wall 13 inserted into the cage main body 11, a front wall 14 integrally formed with the partition wall 13, and a box 15 mounted below the partition wall 13. These components are schematically constructed by a plate work using thin plate, such as steel plate as a material.

Figure 2:
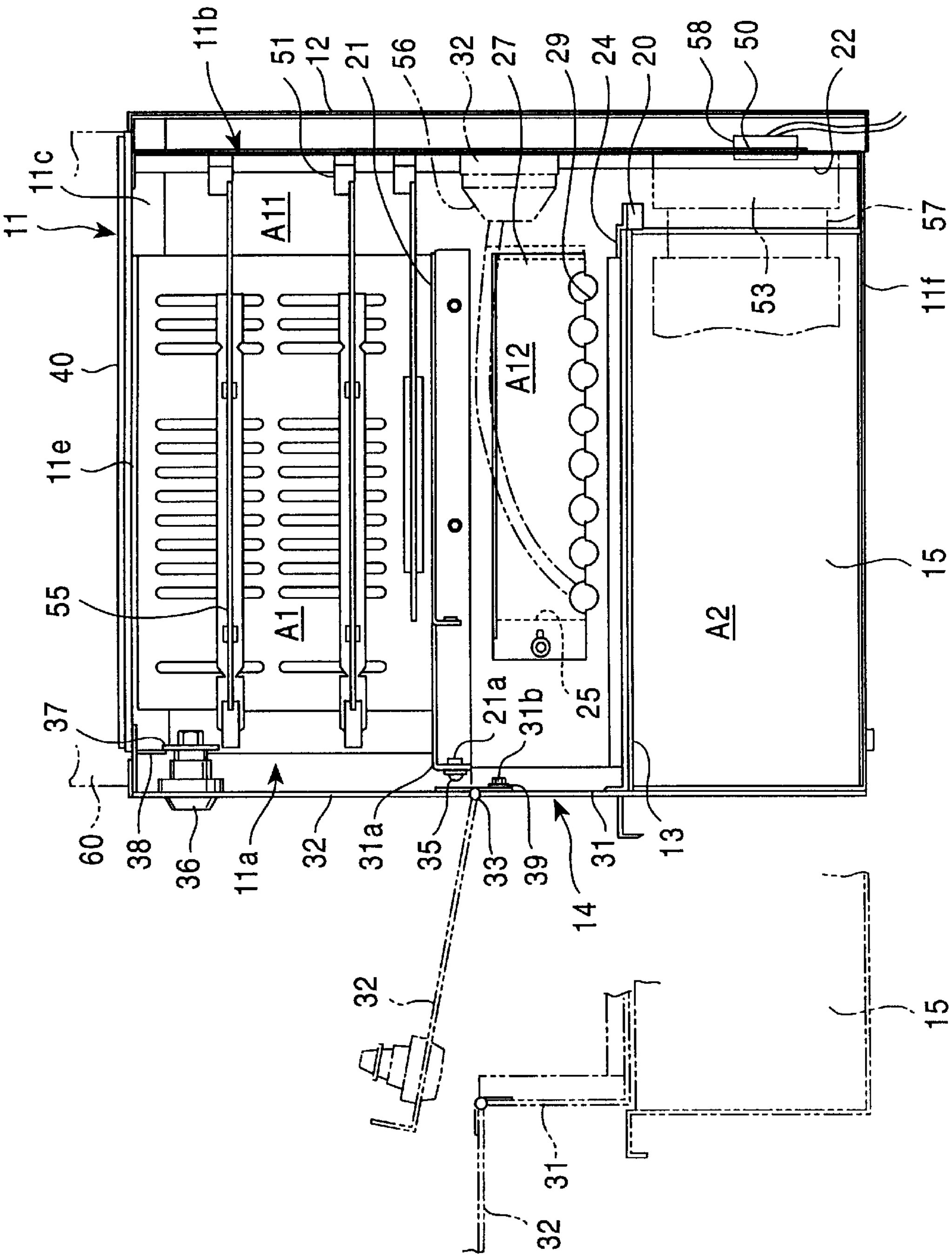
FIG. 2 is a vertical sectional view of the security cage shown in FIG. 1 in a longitudinal direction.
Figure 3:
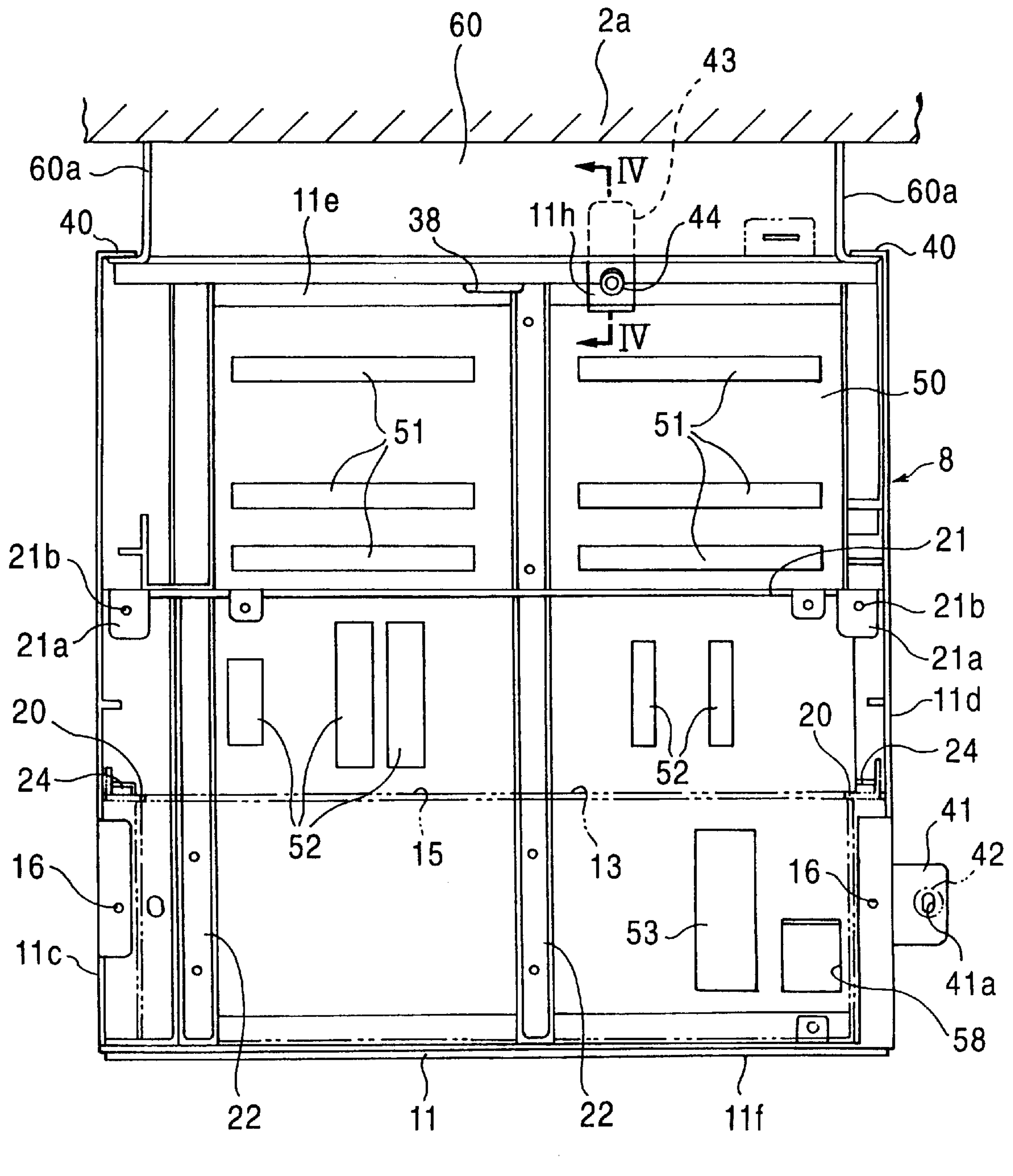
FIG. 3 is a vertical sectional view of the security cage shown in FIG. 1 in a lateral direction.

As shown in FIGS. 2 and 3, the cage main body 11 is formed into the shape of a frame such that it has openings 11*a* and 11*b* formed at the front and back thereof, and is surrounded by side walls 11*c* and 1*d*, an upper wall 11*e* and a lower wall 11*f*. Inside the cage main body 11, there are provided a pair of guide rails 20 extending longitudinally along the side walls 11*c* and 11*d*, an intermediate wall (partition means) 21 placed between the side walls 11*c* and 11*d* at the upper portion of the guide rails 20 and a plurality of (two) supports 22 stretched between the upper wall 11*e* and the lower wall 11*f*. A mother board 50 serving as a control board is mounted to the supports 22 by means of screws (not shown) from the back of the cage main body 11. The back cover 12 is mounted to the opening 11*b* formed at the back of the cage main body 11 so as to hide the mother board 50. The supports 22 constitute a mounting portion of the substrate.

The partition wall 13 is inserted into the cage main body 11 along the upper surface of the guide rails 20, whereby the inside of the cage main body 11 is divided into an upper inaccessible region A1 and a lower accessible region A2 by the partition wall 13. Further, the inaccessible region A1 is divided into an upper substrate region A11 and a lower connector region A12 by the intermediate wall 21. Punched holes 25 and 26 are formed in the side walls 11*c* and 11*d* of the cage main body 11 so as to oppose the connector region A12, and covers 27 and 28 are fitted to the punched holes 25 and 26 from the inside of the cage main body 11, whereby a plurality of cable threading holes 29 are formed.

The front wall 14 includes a fixed wall portion 31 for closing the connector region A12, and a lid 32 for closing the substrate region A11. The fixed wall portion 31 is integrally formed with the partition wall 13. For example, the partition wall 13 is bent perpendicularly upward at the front end thereof to form the fixed wall portion 31. The lid 32 is rotatably connected to the fixed wall portion 31 through hinges 33. A pair of left and right attachment plates 31*a* are provided on the upper end of the fixed wall portion 31 such that they project at the side of the lid 32 rather than the center of rotation of the hinges 33. On the front end of the intermediate wall 21, backing plates 21*a* are provided correspondingly to the attachment plates 31*a*.

The partition wall 13 is inserted into the cage main body 11 to bring the attachment plates 31*a* of the front wall 14 into intimate contact with the backing plates 21*a* of the cage main body 11, respectively, and then, screws 35 are fitted to the attachment plates 31*a* and screwed into female screw holes 21*b* (see FIG. 1) of the backing plates 21*a*, whereby the partition wall 13 and the front wall 14 are fixed to the cage main body 11. At this time, the rear end portion of the partition wall 13 is inserted into a space formed between partition wall holders 24 provided on the guide rails 20, thereby preventing a lifting thereof.

When the partition wall 13 and the front wall 14 are mounted to the cage main body 11 to close the lid 32, the screws 35 are hidden within the inaccessible region A1. A lock 36 is attached to the lid 32. When a rotation shaft (not shown) of the lock 36 is rotationally operated using a predetermined key with the lid 32 closed, a lock plate 37 connected to the rotation shaft comes into engagement with a retaining plate 38 fixed on the side of the inner surface of the cage main body 11, so that the lid 32 is prevented from being opened. The front wall 14 and the partition wall 13 cannot be dismounted from the cage main body 11 by operating the screws 35 as long as the lid 32 is opened by inserting the key into the lock 36 to disengage the lock plate 37 from the retaining plate 38. The hinges 33 are fixed to the inner surface of the fixed wall portion 31 (the surface opposing the inaccessible region A1) by welding and so forth, and are secured to screws 31*b* projected on the inner surface of the fixed wall portion 31 by the use of nuts 39 (see FIG. 2). Therefore, the lid 32 cannot be opened by removing the hinges 33 from the outside of the cage main body 11.

A single or a plurality of sockets 51, 52 and 53 are provided on the mother board 50 so as to oppose each of the regions A11, A12 and A2, respectively. Various types of electric substrates 55, such as a main control board mounting thereon a CPU, an interface substrate, and so forth, are fitted to the socket 51 of the substrate region A11, and a cable 56 for linking the mother board 50 and the inside and outside components of the security cage 8 is connected to a substrate of the connector region A12.

On the other hand, an electric component, such as a power-supply voltage conversion unit 57, accommodated in the box 15 is connected to the socket 53 of the accessible region A2. The box 15 is fixed to the cage main body 11 by screws (not shown) attached to the mounting holes 15*a* formed in the left and right ends of the front surface thereof into female screw holes 16 of the cage main body 11. The box 15 can be inserted in and extracted from the accessible region A2 only by unscrewing the screws. A power introduction section 58 is provided under the mother board 50. A cable is drawn out of the back of the power introduction section 58, and the cable is drawn out below the cage 8 through a threading hole (not shown) formed in the lower wall 11*f* of the cage main body 11 so as to be connected to the AC power-supply unit 9 shown in FIG. 5.

A pair of mount rails 40 are formed on the left and right ends of the upper wall 11*e* of the cage main body 11. In addition, a mount flange 41 is formed at the rear end of the right side wall 11*d*. As shown in FIGS. 3 and 5, an intermediate wall 2*a* is formed below the monitor 7, and a cage support member 60 is integrally fixed to the lower surface of the intermediate wall 2*a*. The cage support member 60 has a pair of suspending plates 60*a* formed at the left and right ends thereof.

When the cage main body 11 is mounted to the housing 2, the mother board 50 and the back cover 12 are first mounted to the cage main body 11, and a cable is attached to the power introduction section 58 of the mother board 50 and the cable is drawn out of the cage. Thereafter, the cage main body 11 is pushed into the housing 2 in such a manner that the suspending plates 60*a* of the cage support member 60 are inserted into clearances between the mount rails 40 and the upper wall 11*e* of the cage main body 11, whereby the cage main body 11 is suspended from the intermediate wall 2*a*. The screw 42 is attached to a slot 41*a* so as to be screwed into a screw hole (not shown) of the housing 2. Thereafter, the key 43 is fitted into the cage main body 11, so that removal of the cage 8 from the housing 2 is restricted.

Figure 4:
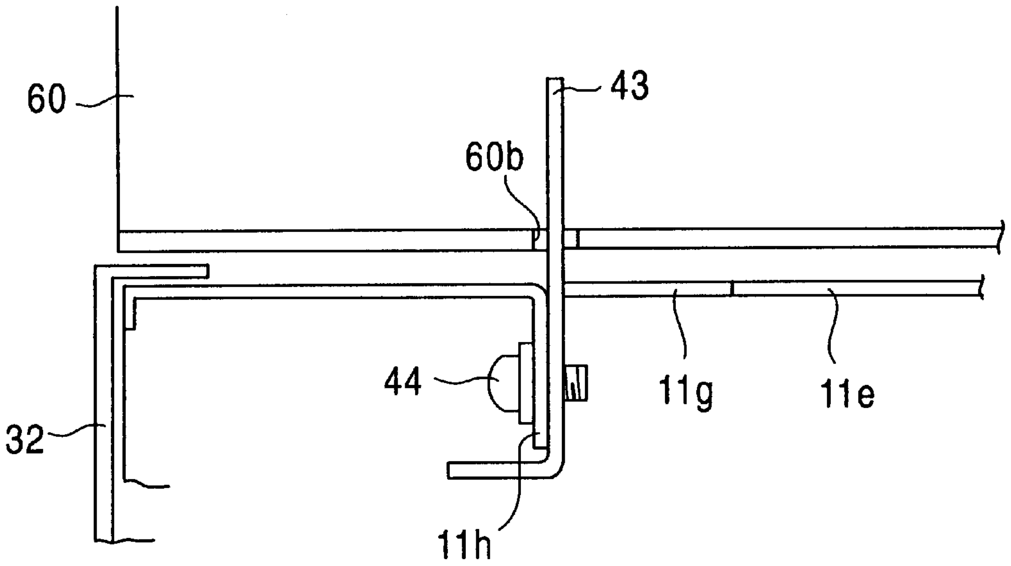
FIG. 4 is a sectional view taken along the line IV—IV of FIG. 3.

That is, as shown in FIGS. 1, 3 and 4, a rectangular punched hole 11*g* is formed in the upper wall 11*e* of the cage main body 11, and a key-mounting portion 11*h* extending towards the inner surface of the cage main body 11 is disposed at the front edge of the punched hole 11*g*. A through hole 60*b* is formed in the cage support member 60 correspondingly to the key-mounting portion 11*h*. After the cage main body 11 has been mounted to a predetermined position in the housing 2, the key 43 is inserted into the cage main body 11, and the upper end thereof is inserted into the through hole 60*b* through the punched hole 11*g*. Then, the key 43 is secured to the key-mounting portion 11*h* by the screw 44 attached inside the cage main body 11. Therefore, the screw 44 becomes inoperable when the lid 32 is closed, and the cage main body 11 cannot be removed from the housing 2 as long as the lock 36 is unlocked to open the lid 32.

As shown in FIG. 1, a microswitch 46 for detecting the opening and closing of the lid 32, and a fan 47 for cooling are also accommodated in the inaccessible region A1 of the cage main body 11.

According to the arrangements as described above, the substrate region A11 in the inaccessible region A1 of the cage main body 11 cannot be opened to the outside as long as the lock 36 of the lid 32 is unlocked to open the lid 32, as shown by the imaginary line in FIG. 2. In addition, it is impossible to remove the front wall 14 and the partition wall 13 from the cage main body 11 by unscrewing the screws 35, and to remove the whole security cage 8 from the housing 2 by removing the key 43. Therefore, only a person who has the key for the lock 36 can access the electric substrate 55 and the cable 56 accommodated in the inaccessible region A1, thus realizing extremely high safety.

The power-supply voltage conversion unit 57 can be easily taken out of the box 15 in comparison with the components accommodated in the inaccessible region A1, so that maintenance and checking does not become troublesome. Moreover, by removing the box 15 from the cage main body 11 when the front wall 14 and the partition wall 13 are pulled out of the cage main body 11 to attach and detach the cable 56, a sufficient operating space is secured below the cable 56, thereby facilitating the operation.

The present invention is not limited to the above-described embodiment, and various changes and modifications may be made. For example, the partition wall 13 formed separately from the front wall 14 may be detachably or undetachably provided on the cage main body 11. The intermediate wall 21 may be removed so as to open and close the whole inaccessible region A1 with the lid 32. The electric components to be accommodated in the regions A11, A12 and A2 may be suitably changed in accordance with the degree of prevention from being attached and detached, and the frequency of attachment and detachment. That is, all the components to be prevented from being attached and detached may be accommodated in the inaccessible region A1. Of such components, one which is frequently attached and detached may be accommodated in the substrate region A11 that can be opened and closed by the lid 32, and one which is not so frequently attached and detached may be accommodated in the connector region A12. The component which is not particularly prevented from being attached and detached may be accommodated in the accessible region A2.

As described above, according to the present invention, the inside of the security cage is divided into the inaccessible region and the accessible region, and only the inaccessible region is restricted in opening by means of the lock. Thus, even the components other than those to be prevented from being attached and detached can be accommodated in the single cage, and the components to be accommodated in the accessible region are not excessively prevented from being attached and detached. Therefore, the electric components in the housing can be arranged collectively in one space, and the number of cables to be routed within the housing can be reduced to organize the inside of the housing, thereby increasing operability and appearance.

Particularly, when the partition wall is formed integrally with the front wall so as to be inserted in and extracted from the cage main body, the accessible region can be used as various types of operation space for the components accommodated in the inaccessible region, thereby further facilitating the operation. In addition, the inaccessible region is further divided into a plurality of regions, and a part thereof is opened and closed by a lid, whereby the positions of the accommodated components can be changed in accordance with the frequency of attachment and detachment of the components, and maintenance and checking so as to organize the inside of the cage. Further, by providing a case which can be inserted in and extracted from the accessible region, the components in the accessible region can be attached and detached more easily. Still further, by mounting the control board across the inaccessible region and the accessible region, the number of cables connecting the components accommodated in each region can be decreased to reduce the number of steps of the wiring operation, thereby further organizing the inside of the housing.

What is claimed is:

1. A security cage for a game machine installed in a housing of the game machine so as to accommodate various types of electric components, said security cage comprising:

a cage main body having an opening provided at the front thereof;

a partition wall for dividing the inside of said cage main body into an inaccessible region and an accessible region each communicating with said opening;

a front wall being provided so as to close said inaccessible region, and having an openable-and-closable lid provided at least at a part thereof;

connecting means being hidden within said inaccessible region when said lid is closed, and connecting said front wall and said cage main body at positions where said connecting means can be operated from the outside of said cage main body when said lid is opened;

lock means for restricting the opening and closing of said lid;

partition means for partitioning said inaccessible region into a first region adjacent to said accessible region via said partition wall and a second region separated from said accessible region by said first region;

wherein said front wall is integrally formed with said partition wall so as to be attachable and detachable to and from said cage main body;

wherein said front wall includes a fixed wall portion integrally formed with said partition wall and fixed to said cage main body through said connecting means so as to close said first region; and wherein said lid is connected to said fixed wall portion so as to open and close said second region.

2. A security cage for a game machine installed in a housing of the game machine so as to accommodate various types of electric components, said security cage comprising:

a cage main body having an opening provided at the front hereof;

a partition wall for dividing the inside of said cage main body into an inaccessible region and an accessible region each communicating with said opening;

a front wall being provided so as to close said inaccessible region, and having an openable-and-closable lid provided at least at a part thereof;

connecting means being hidden within said inaccessible region when said lid is closed and connecting said front wall and said cage main body at positions where said connecting means can be operated from the outside of said cage main body when said lid is opened;

lock means for restricting the opening and closing of said lid; and a case capable of being inserted in and extracted from said accessible region.

3. A security cage for a game machine according to claim 1, wherein mounting portions for a control board are provided at the back of said cage main body across said inaccessible region and said accessible region.

4. A game machine, comprising a cage main body having an opening provided at the front thereof; a partition wall for dividing the inside of said cage main body into an inaccessible region and an accessible region each communicating with said opening; a front wall being provided so as to close said inaccessible region, and having an openable-and-closable lid provided at least at a part thereof; connecting means being hidden within said inaccessible region when said lid is closed, and connecting said front wall and said cage main body at positions where said connecting means can be operated from the outside of said cage main body when said lid is opened; lock means for restricting the opening and closing of said lid; and partition means for partitioning said inaccessible region into a first region adjacent to said accessible region via said partition wall and a second region separated from said accessible region by said first region, wherein said front wall is integrally formed with said partition wall so as to be attachable and detachable to and from said cage main body, wherein said front wall includes a fixed wall portion integrally formed with said partition wall and fixed to said cage main body through said connecting means to so as to close said first region, wherein said lid is connected to said fixed wall portion so as to open and close said second region and wherein mounting portions for a control board are provided at the back of said cage main body across said inaccessible region and said accessible region;

wherein a control board extending across said inaccessible region and said accessible region is mounted at the back of said cage main body;

wherein connecting means for first electric components to be prevented from being attached and detached are provided at a portion of said said control board opposing said inaccessible region; and wherein connecting means for second electric components to be less strongly prevented from being attached and detached than said first electric components is provided at a portion of said control board opposing said accessible region.

5. A game machine according to claim 4, wherein said inaccessible region is divided into a first region adjacent to said accessible region via said partition wall and a second region separated from said accessible region by said first region; and wherein an electric substrate having mounted thereon a control board is accommodated in said second region, and a flexible cable is accommodated in said first region so as to be connected to said control board.

6. A game machine according to claim 5, wherein a case capable of being inserted and extracted is provided in said accessible region, and a component related to a power control is accommodated in said case.

7. A security cage for a game machine installed in a housing of the game machine and which accommodates electric components, said security cage comprising:

a cage main body having an opening a provided at the front thereof;

a partition wall dividing the inside of said cage main body into an inaccessible region and an accessible region each communicating with said opening;

a front wall closing said inaccessible region and having an openable-and-closable lid provided at least on a part thereof;

connecting means connecting said front wall and said cage main body, said connecting means being hidden within said inaccessible region thereby being inaccessible when said lid is closed, said connecting means being accessible from the outside of said cage main body when said lid is opened;

lock means for restricting the opening and closing of said lid;

partition means partitioning said inaccessible region into a first region adjacent to said accessible region and separated from said accessible region by said partition wall and a second region separated from said accessible region by said first region;

said front wall including a fixed wall portion integrally formed with said partition wall to thereby form a front wall-partition wall unit which is attachable and detachable to and from said cage main body;

said fixed wall portion being connected to said cage main body by said connecting means so as to close said first region; and said lid being connected to said fixed wall portion so as to open and close said second region.

* * * * *